(12) United States Patent
Yang et al.

(10) Patent No.: US 9,933,501 B2
(45) Date of Patent: Apr. 3, 2018

(54) MAGNETIC RESONANCE IMAGING (MRI) COIL WITH INTEGRATED DECOUPLING

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Yong Wu, Cleveland, OH (US); Matthew Finnerty, University Heights, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 873 days.

(21) Appl. No.: 14/450,312

(22) Filed: Aug. 4, 2014

(65) Prior Publication Data
US 2016/0033594 A1    Feb. 4, 2016

(51) Int. Cl.
*G01R 33/36* (2006.01)
(52) U.S. Cl.
CPC ................... *G01R 33/3657* (2013.01)
(58) Field of Classification Search
CPC ............... G01N 24/081; G01N 24/082; G01R 33/34053; G01R 33/3657
See application file for complete search history.

(56) References Cited

U.S. PATENT DOCUMENTS

| | | | |
|---|---|---|---|
| 4,083,006 A | 4/1978 | Yokoshima | |
| 4,605,899 A | 8/1986 | Eumurian et al. | |
| 4,775,837 A | 10/1988 | Roeschmann et al. | |
| 4,816,766 A | 3/1989 | Zabel et al. | |
| 5,565,778 A | 10/1996 | Brey et al. | |
| 6,414,488 B1* | 7/2002 | Chmielewski | G01R 33/3657 324/311 |
| 6,636,040 B1 | 10/2003 | Eydelman | |
| 6,847,210 B1 | 1/2005 | Eydelman et al. | |
| 7,573,432 B1 | 8/2009 | Eydelman et al. | |

(Continued)

FOREIGN PATENT DOCUMENTS

WO    2013013680 A1    1/2013

OTHER PUBLICATIONS

Non-Final Office Action dated Nov. 3, 2016 for U.S. Appl. No. 14/270,399.

(Continued)

*Primary Examiner* — Dixomara Vargas
(74) *Attorney, Agent, or Firm* — Eschweiler & Potashnik, LLC

(57) ABSTRACT

Example magnetic resonance imaging (MRI) radio frequency (RF) coils are described. An MRI RF coil may include an LC circuit and an integrated decoupling circuit. The integrated decoupling circuit may include a wire or other conductor that is connected to the LC circuit and that is positioned within a defined distance of the LC circuit. The integrated decoupling circuit may include a PIN diode and a tunable element. The tunable element may be tunable with respect to resistance, capacitance, or inductance, and thus may control, at least in part, the frequency at which the LC circuit resonates during RF transmission. The example MRI RF coil has more than one point of high impedance, which facilitates reducing heating and operational issues associated with conventional coils.

18 Claims, 8 Drawing Sheets

(56) References Cited

U.S. PATENT DOCUMENTS

| | | | | |
|---|---|---|---|---|
| 7,778,682 B2* | 8/2010 | Kumar | ............... | A61B 5/055 |
| | | | | 600/411 |
| 7,800,368 B2* | 9/2010 | Vaughan | ............ | G01R 33/5612 |
| | | | | 324/318 |
| 8,013,609 B2* | 9/2011 | Vartiovaara | ........ | G01R 33/3657 |
| | | | | 324/318 |
| 8,040,586 B2* | 10/2011 | Smith | ................. | B82Y 20/00 |
| | | | | 330/4.9 |
| 8,269,499 B2* | 9/2012 | Hamamura | ........ | G01R 33/3642 |
| | | | | 324/318 |
| 8,754,647 B2* | 6/2014 | Van Helvoort | .... | G01R 33/3657 |
| | | | | 324/318 |
| 8,830,556 B2* | 9/2014 | Smith | ................. | B82Y 20/00 |
| | | | | 250/505.1 |
| 2013/0069652 A1 | 3/2013 | Otake et al. | | |
| 2015/0323620 A1 | 11/2015 | Yang et al. | | |

OTHER PUBLICATIONS

Notice of Allowance dated Feb. 15, 2017 for U.S. Appl. No. 14/270,399.

Cassidy et al., Determining the Tuning and Matching Requirements of RF Coils Using Electromagnetic Simulation and Electric Circuit Analysis, 2005, Concepts in Magnetic Resonance Part 8 (Magnetic Resonance Engineering), vol. 258 (1), pp. 27-41.

U.S. Appl. No. 15/596,118, filed May 16, 2017.

* cited by examiner

MAGNETIC RESONANCE IMAGING (MRI) COIL WITH INTEGRATED DECOUPLING

BACKGROUND

Magnetic resonance imaging (MRI) involves the transmission and receipt of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission techniques.

RF coils create the B1 field that rotates the net magnetization in a pulse sequence. RF coils may also detect precessing transverse magnetization. Thus, RF coils may be transmit coils, receive coils, or transmit and receive coils. Typically, the transmitted RF signals are orders of magnitude larger than the MR signals generated by the excited nuclei and detected by the RF receive coils. To protect the receive coils and receiver circuits and apparatus, the receive coils may be decoupled or detuned while RF is being transmitted by an MR apparatus. The decoupling or detuning may be active or passive. Active decoupling involves, for example, applying a bias to a PIN diode semiconductor switch in conjunction with an LC circuit during RF transmission. Passive decoupling involves, for example, using antiparallel diode semiconductor switches in conjunction with LC circuitry. The antiparallel diode semiconductor switches are switched upon detecting high power RF transmit pulses, which allows high currents, but not low currents, to interact with the parallel resonant LC circuit that decouples the coil.

An imaging coil needs to be able to resonate at a selected Larmor frequency. Imaging coils include inductive elements and capacitive elements. The resonant frequency, v, of an RF coil is determined by the inductance (L) and capacitance (C) of the inductor capacitor circuit according to:

$$v = \frac{1}{2\Pi\sqrt{LC}}$$

Imaging coils may need to be tuned. Tuning an imaging coil may include varying the performance of a capacitor. Recall that frequency: $f=\omega/(2\pi)$, wavelength: $\lambda=c/f$, and $\lambda=4.7$ m at 1.5 T. Recall also that the Larmor frequency: $f_0=\gamma B_0/(2\pi)$, where $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

When MRI coils that are tuned to the same radio frequency are positioned close together, which may occur, for example, in phased array coils, the MRI coils may inductively couple to each other, which causes the MRI coils to detune each other. Detuning due to inductive coupling reduces image quality as compared to using single coils individually. Conventional phase array coils may address the detuning due to inductive coupling problem by overlapping coils or by using preamplifiers that dampen current flow in individual coils.

Referring to Prior Art FIG. 1, a single RF coil segment 802 is shown schematically to include an inductance 803, a resistance 804, and a capacitance 805. Capacitance 805 is selected to tune the segment 802 to a desired frequency (e.g., Larmor frequency). The RF coil segment 802 is connected across the output of a current control circuit 806 that is driven by an input signal 807 to produce a current in the RF coil segment 802. Unfortunately, an additional induced current may also flow through the RF coil segment 802 due to signals indicated at 808 induced by currents flowing in other (e.g., adjacent) RF coil segments. With multiple driving loops tuned at a single image frequency, which may occur in a phased array coil, the current on a loop is a superposition of the driven current and currents induced by other transmitters due to electromagnetic induction.

Conventionally, attempts to reduce, minimize, or eliminate the coupling through the mutual impedance in two interacting elements may have been attempted by cancelling the mutual impedance or by reducing the current in the coil. Mutual inductance may be cancelled by either partial overlap of adjacent coils, which may be referred to as transformer type decoupling, or by using decoupling capacitors. Other conventional approaches include using a preamplifier decoupling network to isolate coil elements by creating a large impedance block at the terminals of a receive element, which suppresses currents driven by the spin induced electromotive force (emf).

There are many design issues associated with MRI RF coil design. For example, the inductance of a conventional coil depends on the geometry of the coil. For a square coil with a side length a and wire diameter f: $L=[\mu_0/\pi][-4a+2a\sqrt{2}-2a\log(1+\sqrt{2})+2a\log(4a/f)]$. For a loop coil with loop diameter d and wire diameter f: $L=[\mu_0 d/2][\log(8d/f)-2]$. Thus, the selection of the geometry of a coil determines, at least in part, the inductance of the coil.

The resistance of a coil also depends on the geometry of the coil. The resistance R of a conductor of length l and cross-sectional area A is $R=\rho l/A$, where $\rho$ is the conductor resistivity and is a property of the conductor material and the temperature. For a copper wire coil with loop diameter d and wire diameter f: $R=d\rho_{Cu}/(f\delta_{Cu})$. For a copper foil coil with loop diameter d, copper thickness t, and copper width w: $R=\pi d\rho_{Cu}/(2w\delta_{Cu})$, where t is much greater than the copper skin depth and w is much greater than t. Thus, the selection of the geometry of a coil and the material (e.g., wire, foil) determines, at least in part, the inductance of the coil. The length of the loop also impacts the properties of the coil.

Coils may be characterized by their signal voltage, which is the electromotive force (emf) induced in a coil: $\xi=-\partial\varphi/\partial t \propto -\partial(B_1 \cdot M_0)/\partial t$, where $\varphi$ is the magnetic flux across the coil (closed loop), magnetization $M_0=N\gamma^2(h/(2\pi))^2 s(s+1)B_0/(3k_B T_S)=\sigma_0 B_0/\mu_0$, where N is the number of nuclear spins s per unit volume (s=1/2 for protons) and $T_s$ is the temperature of the sample. Since $\omega_0=\gamma B_0$, $\xi \propto \omega_0^2$. The noise in a coil may be thermal (e.g., $v=(4k_B T_S R \Delta f)^{1/2}$, where R is the total resistance and $\Delta f$ is the bandwidth of the received signal). The signal to noise ratio (SNR) for a coil may be described by $\xi/v$.

Coils may be used for transmitting RF energy that is intended to cause nuclear magnetic resonance (NMR) in a sample. The frequency at which NMR will be created depends on the magnetic field present in the sample. Both the main magnetic field B0 produced by the MRI apparatus and the additional magnetic field B1 produced by a coil contribute to the magnetic field present in the sample. For a circular loop coil, the transmit B1 field equals the coil sensitivity. A circular loop of radius a carrying a current I produces on axis the field: $B=\mu_0 I a^2/[2(a^2+z^2)^{3/2}]$.

RF coils for MRI may need to be tuned and matched. Tuning involves establishing or manipulating the capacitance in a coil so that a desired resistance is produced. Matching involves establishing or manipulating the capacitance in a coil so that a desired reactance is achieved. When tuning, the impedance z may be described by $Z=R+jX=1/(1/(r+jL\omega)+jC\omega)$. Tuning may be performed to achieve a desired tuning frequency for a coil. $\omega_0$ identifies the desired tuning frequency. $\omega_0$, may be, for example, 63.87 MHz at 1.5 T. The size of a conventional coil facilitates estimating inductance L. With an estimate of L in hand, values for capacitors can be computed to produce a desired resonant peak in an appropriate location with respect to $\omega_0$. Once capacitors are selected, the resonant peak can be observed and a more accurate L can be computed. The capacitors can then be adjusted to produce the desired resistance. Once the desired resistance is achieved, then capacitance can be adjusted to cancel reactance.

Conventional coils may use PIN diodes. When forward-biased, a PIN diode may produce a negligible resistance (e.g., 0.1Ω), which is essentially a short-circuit. When reverse-biased, a PIN diode may produce a high resistance (e.g., 200 kΩ) in parallel with a low capacitance (e.g., ~2 pF), which is essentially an open-circuit.

Thus, conventional coil design may be a complicated process that requires numerous decisions. Additionally, conventional coil fabrication may be a complicated process that requires accurately implementing manufactures that reflect the design decisions.

Prior Art FIG. 2 illustrates a schematic of a simple conventional RF coil 100 for MRI. The coil 100 is illustrated as a loop 110. Loop 110 has elements that produce a resistance (R) (e.g., resistor 120) and that produce an inductance (L) (e.g., inductor 130). A conventional loop may include a matching capacitor 140 and tuning capacitor 150 that produce capacitance (C). The simple RF coil 100 may be referred to as an LC coil or as an RLC coil. Conventionally, the resistor 120, inductor 130, and capacitor 150 may all have been two terminal passive elements that were soldered to copper wire or copper foil that was attached to a printed circuit board.

A resistor may be, for example, a passive, two-terminal electrical component that implements electrical resistance as a circuit element. Resistors reduce current flow. Resistors also lower voltage levels within circuits. Resistors may have fixed resistances or variable resistances. The current that flows through a resistor is directly proportional to the voltage applied across the resistor's terminals. This relationship is represented by Ohm's Law: V=IR, where I is the current through the conductor, V is the potential difference across the conductor, and R is the resistance of the conductor.

An inductor, which may also be referred to as a coil or reactor, may be a passive two-terminal electrical component that resists changes in electric current. An inductor may be made from, for example, a wire that is wound into a coil. When a current flows through the inductor, energy may be stored temporarily in a magnetic field in the coil. When the current flowing through the inductor changes, the time-varying magnetic field induces a voltage in the inductor. The voltage will be induced according to Faraday's law and thus may oppose the change in current that created the voltage.

A capacitor may be a passive, two-terminal electrical component that is used to store energy. The energy may be stored electrostatically in an electric field. Although there are many types of practical capacitors, capacitors tend to contain at least two electrical conductors that are separated by a dielectric. The conductors may be, for example, plates and the dielectric may be, for example, an insulator. The conductors may be, for example, thin films of metal, aluminum foil or other materials. The non-conducting dielectric increases the capacitor's charge capacity. The dielectric may be, for example, glass, ceramic, plastic film, air, paper, mica, or other materials. Unlike a resistor, a capacitor does not dissipate energy. Instead, a capacitor stores energy in the form of an electrostatic field between its conductors.

When there is a potential difference across the conductors, an electric field may develop across the dielectric. The electric field may cause positive charge (+Q) to collect on one conductor and negative charge (−Q) to collect on the other conductor.

Prior Art FIG. 3 illustrates a schematic of another simple RF coil 200 for MRI. RF coil 200 may also be referred to as an LC coil or as an RLC coil. The coil 200 is illustrated as a square loop 210. Loop 210 has elements that produce a resistance (e.g., resistor 220) and that produce an inductance (e.g., inductor 230). A conventional loop may include a capacitor 240 and capacitor 250 that work together to achieve matching. Once again, the resistor 220, inductor 230, and capacitors 240 and 250 may have been soldered to copper wire or copper foil that was attached to a printed circuit board. Coil 200 is contrasted with coil 1 (Prior Art FIG. 1) that included capacitor 150 for tuning purposes.

Prior Art FIG. 4 illustrates a conventional RLC coil 300 that performs traditional "distributed" decoupling using components L31 and D31. Coil 300 includes capacitors C31, C32, C33, and inductors L31, L32, and L33. Coil 300 includes a pre-amplifier circuit 310. Coil 300 also includes a PIN diode D31. Recall that a PIN diode has a wide, lightly doped near intrinsic semiconductor region positioned between a p-type semiconductor region and an n-type semiconductor region that are used for ohmic contacts. The wide intrinsic region makes the PIN diode suitable for fast switches. Fast switching may be employed in MRI coils. In transmit mode, the PIN diode D1 may be turned off (e.g., shorted).

In conventional coil 300, a single capacitor C32 is illustrated to represent one or more capacitors that may be employed in the coil 300. Thus, capacitor C32 may be an equivalent capacitor of multiple breaking point capacitors that may appear in coil 300 minus capacitor C31. Inductor L32 represents the inductance of the coil. The inductance may be produced, for example, by a copper trace that forms the coil 300.

In the conventional coil 300, capacitor C31 is the breaking point capacitor that is used for decoupling the coil 300 from other MRI coils. Capacitor C31 and inductor L31 are in parallel resonance and the impedance across capacitor C31 is high. Capacitor C31 is a single high impedance point in coil 300. Since the impedance across capacitor C31 is high, an induced voltage on coil 300 cannot generate a large current through capacitor C32. In a conventional coil like coil 300, the single high impedance point (e.g., capacitor C31) may get unacceptably or dangerously hot producing heat dissipation issues that in turn limit the operation of coil 300.

BRIEF DESCRIPTION OF THE DRAWINGS

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

Prior Art

Prior Art

Prior Art

Prior Art

DETAILED DESCRIPTION

Figure 1:
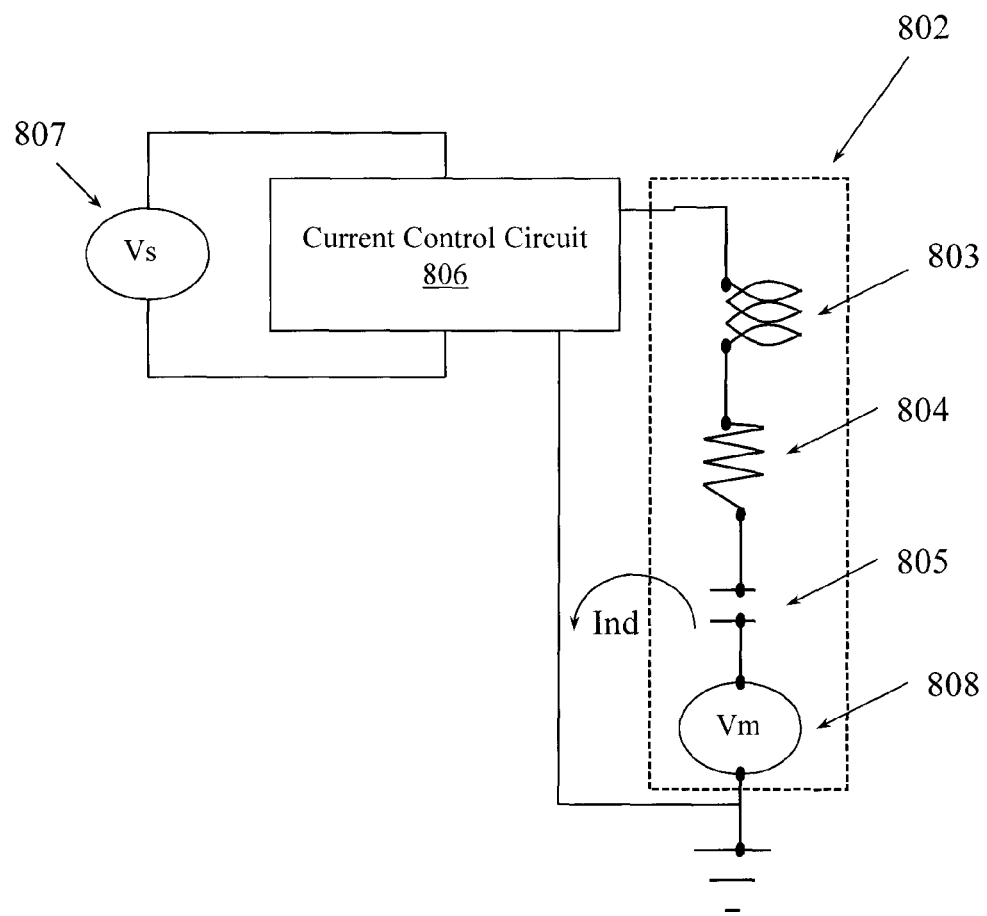
FIG. 1 illustrates a conventional RF coil for MRI that may experience inductive coupling.
Figure 2:
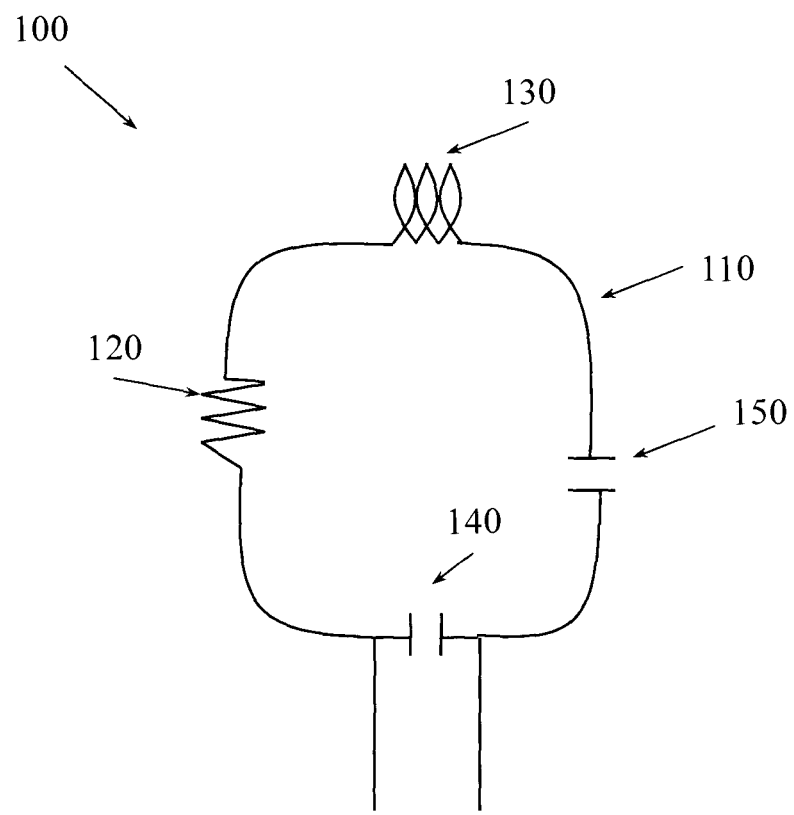
FIG. 2 illustrates portions of a radio frequency (RF) coil for magnetic resonance imaging (MRI).
Figure 3:
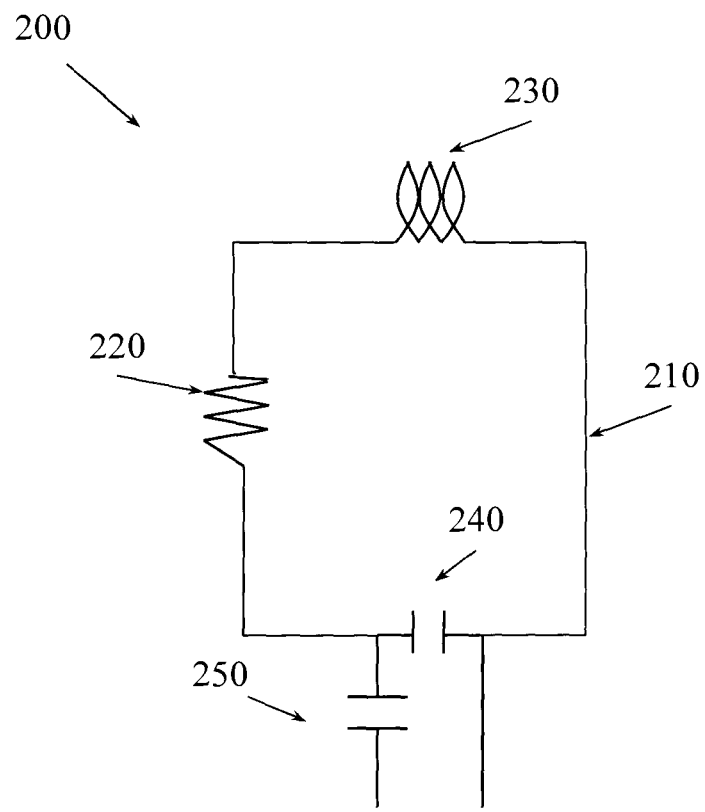
FIG. 3 illustrates portions of an RF coil for MRI.
Figure 4:
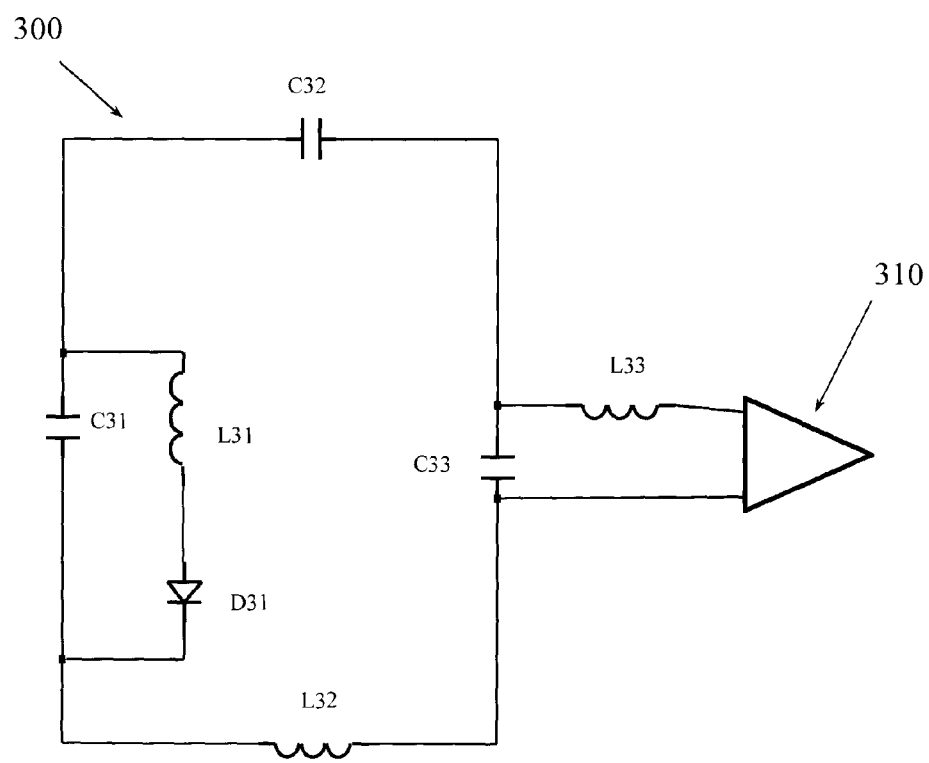
FIG. 4 illustrates an RF coil for MRI that performs conventional decoupling.
Figure 5:
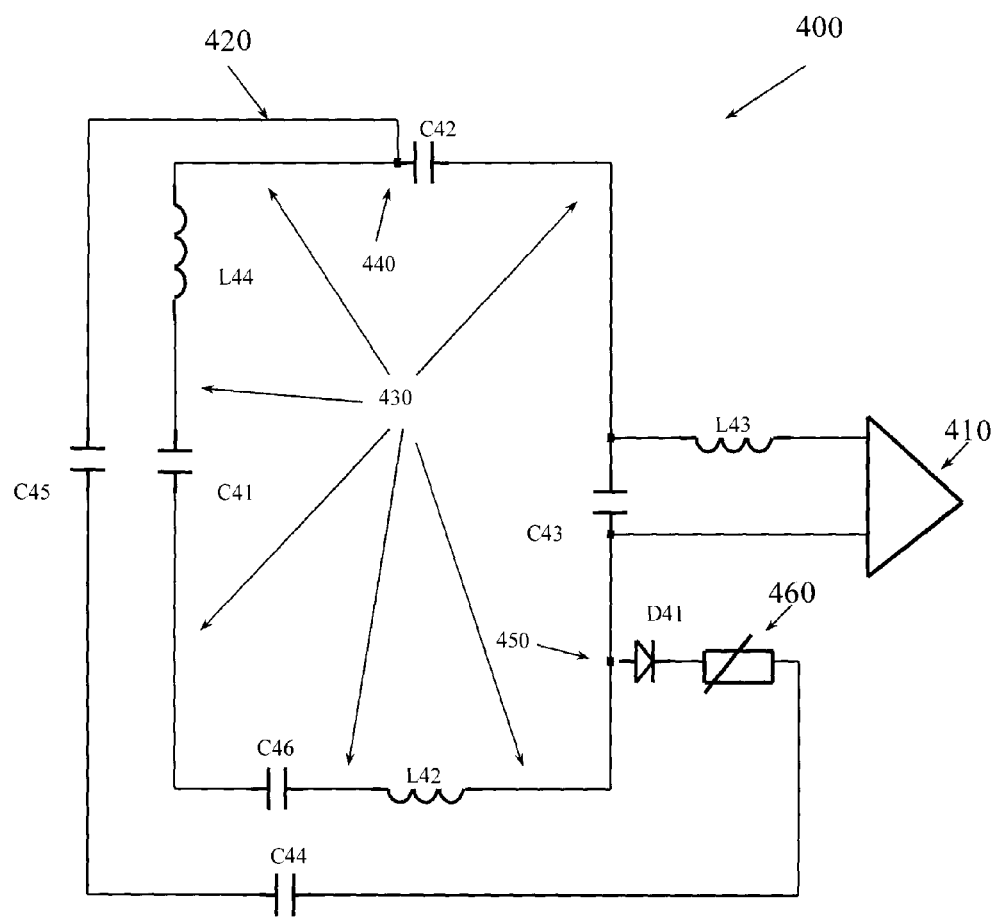
FIG. 5 illustrates an example MRI coil that performs integrated decoupling.

FIG. 5 illustrates an example MRI coil 400 that performs integrated decoupling using a circuit that includes a PIN diode and a tunable element. MRI coil 400 includes capacitors C41, C42, C43, C44, C45, and C46. MRI coil 400 also includes inductors L42, L43, and L44. A greater or lesser number of capacitors and inductors arranged in different configurations may be employed. MRI coil 400 also includes PIN diode D41 and tunable device 460. MRI coil 400 includes a wire or other conductor 420 that is attached to coil 400 at locations 440 and 450. MRI coil 400 also includes a pre-amplifier 410. The portion of coil 400 that includes C42, L44, C41, C46, L42, C43, L43, and pre-amplifier 410 represents an RLC circuit. The portion of coil 400 that includes wire 420, C45, C44, D41, and tunable element 460 represents the integrated decoupling circuit. Wire 420, which may be a conductor other than a wire, is placed at a determined position with respect to the conductor connecting the elements of the RLC circuit.

Capacitors C42, C41, and C46 are breaking point capacitors for coil 400. A wire or other conductor 420 is positioned near coil 400. The conductor 420 is connected from one location (e.g., 440) on the conductor 430 to another location (e.g., 450) on the conductor 430. The conductor 420 may be broken with one or more capacitors (e.g., C45 and C44) and connected back to the coil 400 using, for example, PIN diode D41 and a tunable device (e.g., 460) whose reactance can be adjusted. In one embodiment, the conductor 420 may be placed within one millimeter of the conductor 430. In another embodiment, the conductor 420 may be placed within one centimeter of the conductor 430. In another embodiment, the conductor 420 may be placed between one millimeter and two millimeters of the conductor 430. In another embodiment, the conductor 420 may be placed between one centimeter and two centimeters of the conductor 430.

When the coil 400 is being operated in transmit (tx) mode, PIN diode D41 is on (e.g., shorted) and the tunable device 460 is configured so that inductor L44, capacitor C45, capacitor C44, inductor L42, capacitor C46, capacitor C41 and inductance from conductor 420 and conductor 430 produce resonance at the transmit frequency. When inductor L44, capacitor C45, capacitor C44, inductor L42, capacitor C46, capacitor C41 and inductance from conductor 420 and conductor 430 produce resonance at the transmit frequency, high impedance may be experienced across the capacitors C41 and C46 and inductors L42, and L44. Recall that in conventional coil 300 there may have been a single point of high impedance which may have produced heat issues and operational limitations. Having multiple points of high impedance and having the conductor 420 provide a larger heat sink than a conventional coil reduces heat issues, which in turn reduces operational limits. The coil 400 is designed so that the reactance from point 440 to point 450 in coil 400 while the coil 400 is operating at the transmission frequency is large enough to avoid self-canceling between the capacitors C41 and C46 and inductors L42, and L44.

Compared to prior art coil 300, example coil 400 has multiple points of high impedance that are produced with one diode instead of a single point of high impedance. The wire 420 and additional points of high impedance facilitate reducing the heat at any single capacitor so that high, unacceptable, or dangerous heat levels are not produced as may be the case in conventional coil 300. Additionally, in coil 400, the diode position can be chosen with more freedom. The path of 420, which travels through C45, C44, 460, and D41 is positioned within a threshold distance of the path from 440 to 450. In one embodiment, the path of 420 is within one millimeter of the path from 440 to 450. Positioning path 420 within the threshold distance allows the decoupling current to be self-cancelled, which in turn avoids heating issues or distortions in an imaging area disposed a distance away. Positioning path 420 within the threshold distance also reduces or even minimizes coupling between the transmit field and the area enclosed by the paths.

Figure 6:
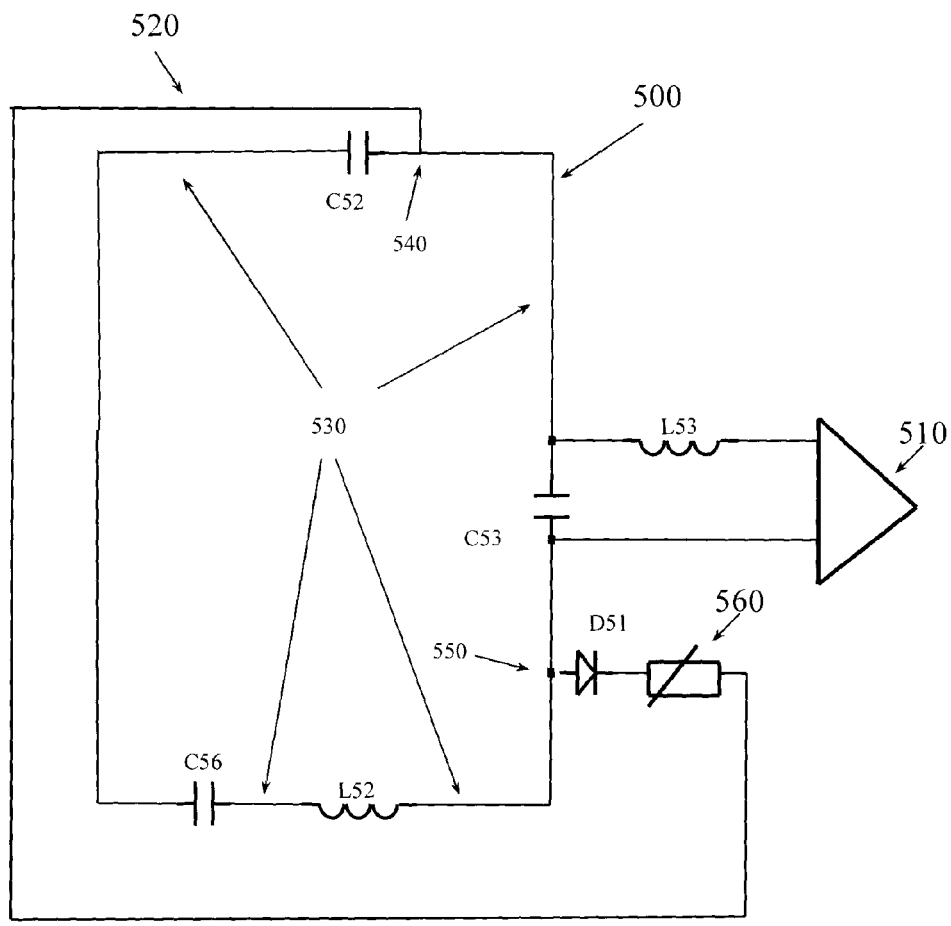
FIG. 6 illustrates an example MRI coil that performs integrated decoupling.

FIG. 6 illustrates an example MRI coil 500 that performs integrated decoupling using a circuit that includes a PIN diode and a tunable element. MRI coil 500 includes capacitors C52, C53, and C56. MRI coil 500 also includes inductors L52 and L53. A greater or lesser number of capacitors and inductors arranged in different configurations may be employed. MRI coil 500 also includes PIN diode D51 and tunable device 560. MRI coil 500 includes a wire or other conductor 520 that is attached to conductor 530 at locations 540 and 550. MRI coil 500 also includes a pre-amplifier 510. The portion of coil 500 that includes C52, C56, L52, C53, L53, and pre-amplifier 510 represents an LC or RLC circuit. The portion of coil 500 that includes conductor 520, C54, tunable element 560, and PIN diode D51 represents the integrated decoupling circuit.

When the coil 500 is being operated in transmit (tx) mode, PIN diode D51 is on (e.g., shorted) and the tunable device 560 is configured so that capacitor C54, inductor L52, capacitor C56, and inductance from conductor 520 and conductor 530 produce resonance at the transmit frequency. When capacitor C54, inductor L52, capacitor C56, and inductance from conductor 520 and conductor 530 produce resonance at the transmit frequency, high impedance may be experienced across the capacitors C52 and C56 and inductor L52. The coil 500 is designed so that the reactance from point 540 to point 550 in coil 500 while the coil 500 is operating at the transmission frequency is large enough to avoid self-canceling between the capacitors C52 and C56 and inductor L52. While a pin diode is described, in one embodiment a cross diode may be employed. In different embodiments, the pin diode may be employed when direct current (DC) is in use while the cross diode may be employed without direct current. In different embodiments, the pin diode may be be used for active decoupling and the cross diode may be used for passive decoupling.

Compared to prior art coil 300, example coil 500 has multiple points of high impedance that are produced with one diode instead of a single point of high impedance. The wire 520 and additional points of high impedance facilitate reducing the heat at any single capacitor so that high, unacceptable, or dangerous heat levels are not produced as may be the case in conventional coil 300. Reducing heat levels by eliminating the single point of high impedance reduces operational limits associated with conventional coils. The path of wire 520 is positioned within a threshold distance of the path from 540 to 550. In one embodiment, the path of wire 520 is within one millimeter of the path from 540 to 550. Positioning wire 520 within the threshold distance allows the decoupling current to be self-cancelled, which in turn avoids heating issues or distortions in an imaging area disposed a distance away. Positioning wire 520 within the threshold distance also reduces or even minimizes coupling between the transmit field and the area enclosed by the paths.

Figure 7:
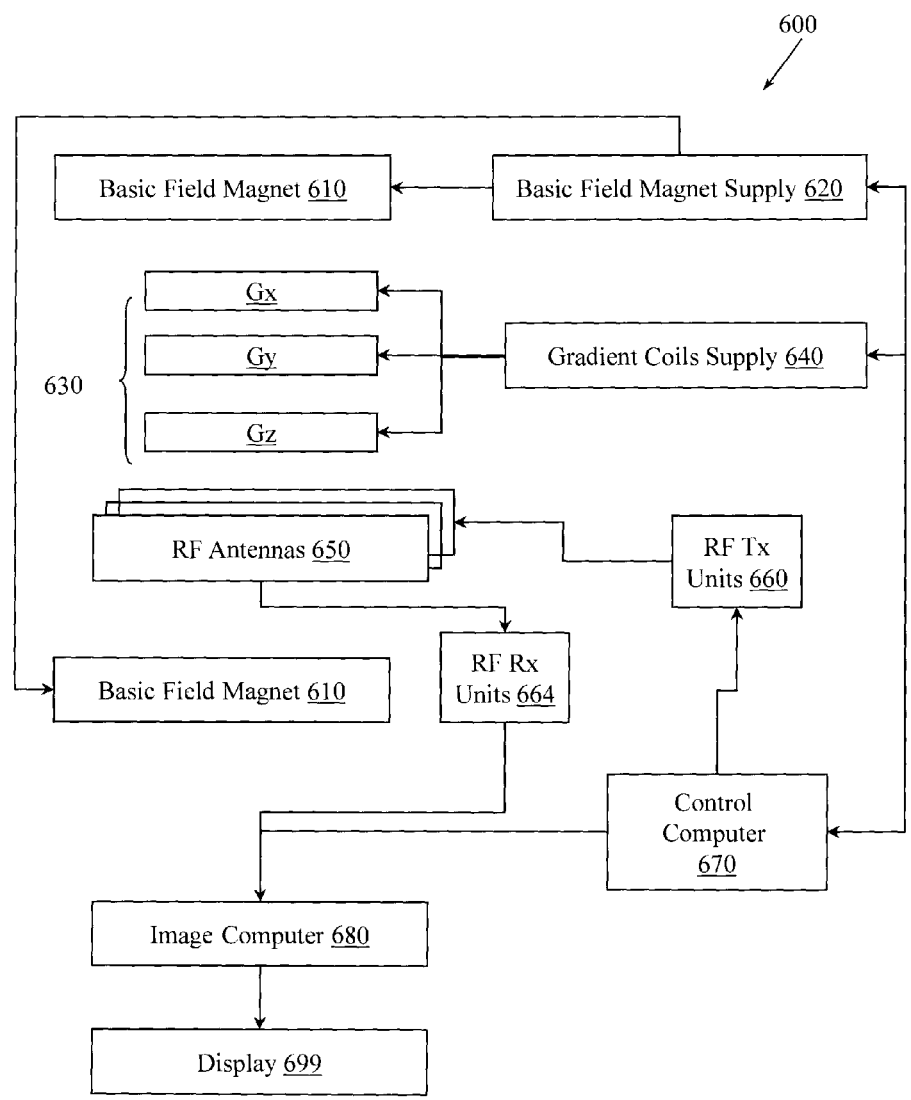
FIG. 7 illustrates an MRI apparatus configured with an example MRI RF coil that performs integrated decoupling.

FIG. 7 illustrates an example MRI apparatus 600 configured with a set of example RLC RF coils having integrated decoupling circuits. The apparatus 600 includes a basic field magnet(s) 610 and a basic field magnet supply 620. Ideally, the basic field magnets 610 would produce a uniform B0 field. However, in practice, the B0 field may not be uniform, and may vary over an object being imaged by the MRI apparatus 600. MRI apparatus 600 may include gradient coils 630 configured to emit gradient magnetic fields like $G_S$, $G_P$ and $G_R$. The gradient coils 630 may be controlled, at least in part, by a gradient coils supply 640. In some examples, the timing, strength, and orientation of the gradient magnetic fields may be controlled and thus selectively adapted during an MRI procedure.

MRI apparatus 600 may include a set of RLC RF antennas 650 having integrated decoupling circuits that are configured to generate RF pulses and to receive resulting magnetic resonance signals from an object to which the RF pulses are directed. The RF antennas 650 may be controlled, at least in part, by a set of RF transmission units 660. An RF transmission unit 660 may provide a signal to a member of the set of RF antennas 650. In one embodiment, members of the set of RF antennas 650 may employ an integrated decoupling circuit that includes a PIN diode and a tunable element like the RF coils described herein.

The gradient coils supply 640 and the RF transmission units 660 may be controlled, at least in part, by a control computer 670. The magnetic resonance signals received from the RF antennas 650 can be employed to generate an image, and thus may be subject to a transformation process like a two dimensional FFT that generates pixilated image data. The transformation can be performed by an image computer 680 or other similar processing device. The image data may then be shown on a display 699. While FIG. 7 illustrates an example MRI apparatus 600 that includes various components connected in various ways, it is to be appreciated that other MRI apparatus may include other components connected in other ways. In one example, MRI apparatus 600 may include control computer 670. In one example, a member of the set of RF antennas 650 may be individually controllable by the control computer 670.

Figure 8:
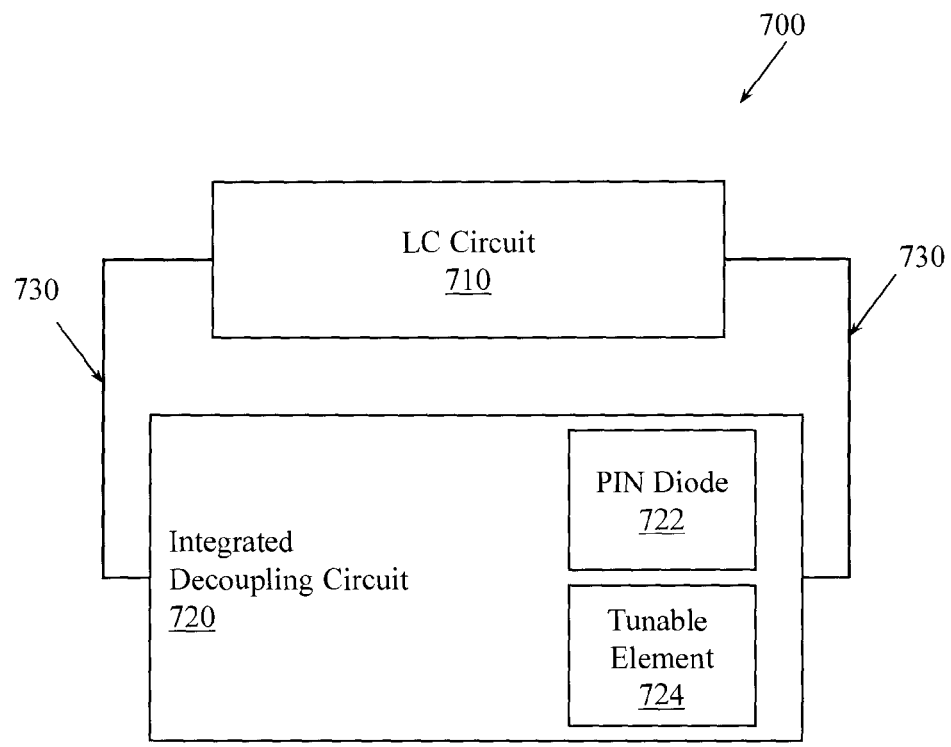
FIG. 8 illustrates an example MRI coil that performs integrated decoupling.

FIG. 8 illustrates an example MRI coil 700 that includes an LC circuit 710 and that performs integrated decoupling using an integrated decoupling circuit (IDC) 720 that includes a PIN diode 722 and a tunable element 724. The IDC 720 includes a wire or other conductor 730 that attaches to the LC circuit 710 at two points. In one embodiment, the PIN diode 722 and tunable element 724 are connected in series in the IDC 720.

MRI coil 700 may be, for example, a receive/transmit coil. Thus, the PIN diode 722 may be driven to different states to selectively block current from flowing through the LC coil 710. For example, during RF transmission the PIN diode 722 may be driven to a state that isolates the IDC 720 from the LC coil 710 to block current from flowing through the LC coil 710. More generally, the PIN diode 722 may be driven to a first state when the RF coil 700 is transmitting RF energy, where the first state blocks current from flowing through the LC circuit 710. Additionally, the PIN diode 722 may be driven to a second different state when the MRI coil 700 is not transmitting RF energy, where the second state allows current to flow through the LC coil 710.

MRI coil 700 may be one of a plurality of receive/transmit coils in an MRI apparatus. Thus, the IDC 720 selectively decouples the MRI RF coil 700 from one or more other MRI RF coils associated with the MRI apparatus. To maintain the decoupling function, elements of the LC circuit 710 and elements of the IDC 720 produce a reactance through the conductor of the IDC 720. The reactance is sufficient to prevent self-cancelling between elements of the LC circuit 710 and elements of the IDC 720. To maintain decoupling, IDC 720 will generate an impedance that is high enough so that no large current can flow through 710 and 720.

In one embodiment, the tunable element 724 controls, at least in part, a frequency at which the RF coil 700 transmits RF energy. In one embodiment, the tunable element 724 may be tunable with respect to resistance that controls, at least in part, the frequency at which the LC circuit 710 resonates during RF transmission. In another embodiment, the tunable element 724 may be tunable with respect to capacitance that controls, at least in part, the frequency at which the LC circuit 710 resonates during RF transmission. In another embodiment, the tunable element 724 may be tunable with respect to inductance that controls, at least in part, the frequency at which the LC circuit 710 resonates during RF transmission.

Recall that conventional coils may have experienced heating issues at a single point of high impedance. Therefore, elements of the LC circuit 710 and elements of the integrated decoupling circuit 720 produce two or more points of high impedance in the RF coil 700. In one embodiment, the high impedance is at least 1 k$\Omega$. Other impedances (e.g., 4 k$\Omega$) may be employed.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

What is claimed is:

1. A magnetic resonance imaging (MRI) radio frequency (RF) coil, comprising:
    an LC circuit, and
    an integrated decoupling circuit attached to the LC circuit and positioned at a fixed, predetermined distance from the LC circuit,
    where the integrated decoupling circuit includes one or more conductors, one or more capacitors, a PIN diode, and a tunable element, where the tunable element controls, at least in part, a frequency at which the MRI RF coil transmits RF energy, and where the PIN diode selectively electrically isolates the integrated decoupling circuit from the LC circuit; and
    where elements of the LC circuit and elements of the integrated decoupling circuit produce a reactance through the conductor of the integrated decoupling circuit, where the reactance is sufficient to prevent self-cancelling between elements of the LC circuit and elements of the integrated decoupling circuit.

2. The MRI RF coil of claim 1, where the integrated decoupling circuit decouples the MRI RF coil from one or more other MRI RF coils.

3. The MRI RF coil of claim 1, where the tunable element is tunable with respect to resistance that controls, at least in part, the frequency at which the LC circuit resonates during RF transmission.

4. The MRI RF coil of claim 1, where the tunable element is tunable with respect to capacitance that controls, at least in part, the frequency at which the LC circuit resonates during RF transmission.

5. The MRI RF coil of claim 1, where the tunable element is tunable with respect to inductance that that controls, at least in part, the frequency at which the LC circuit resonates during RF transmission.

6. The MRI RF coil of claim 1, where the fixed, predetermined distance is within one millimeter.

7. The MRI RF coil of claim 1, where the fixed, predetermined distance is within one tenth of one millimeter.

8. The MRI RF coil of claim 1, where elements of the LC circuit and elements of the integrated decoupling circuit produce two or more points of high impedance in the MRI RF coil, where the high impedance is at least 4 kΩ.

9. The MRI RF coil of claim 1, where elements of the LC circuit and elements of the integrated decoupling circuit produce three or more points of high impedance in the MRI RF coil, where the high impedance is at least 4 kΩ.

10. The MRI RF coil of claim 1, where elements of the LC circuit and elements of the integrated decoupling circuit produce two or more points of high impedance in the MRI RF coil, where the high impedance is at least 1 kΩ.

11. The MRI RF coil of claim 1, where elements of the LC circuit and elements of the integrated decoupling circuit produce three or more points of high impedance in the MRI RF coil, where the high impedance is at least 1 kΩ.

12. The MRI RF coil of claim 1, where the PIN diode is driven to a first state when the MRI RF coil is transmitting RF energy, where the first state blocks current from flowing through the LC circuit.

13. The MRI RF coil of claim 12, where the PIN diode is driven to a second different state when the MRI RF coil is not transmitting RF energy, where the second state allows current to flow through the LC circuit.

14. The MRI RF coil of claim 1, where the PIN diode and tunable element are connected in series in the integrated decoupling circuit.

15. A magnetic resonance imaging (MRI) radio frequency (RF) coil, comprising:
    an LC circuit, and
    an integrated decoupling circuit attached to the LC circuit and positioned at a fixed, predetermined distance from the LC circuit,
    where the integrated decoupling circuit includes one or more conductors, a PIN diode, one or more capacitors, and a tunable element, where the PIN diode and tunable element are connected in series in the integrated decoupling circuit,
    where the PIN diode selectively electrically isolates the integrated decoupling circuit from the LC circuit,
    where the PIN diode is driven to a first state when the MRI RF coil is transmitting RF energy, where the first state blocks current from flowing through the LC circuit, and where the PIN diode is driven to a second different state when the MRI RF coil is not transmitting RF energy, where the second state allows current to flow through the LC circuit,
    where the integrated decoupling circuit decouples the MRI RF coil from one or more other MRI RF coils,
    where the tunable element is tunable with respect to resistance, capacitance, or inductance, where the resistance, capacitance and inductance control, at least in part, the frequency at which the LC circuit resonates during RF transmission,
    where elements of the LC circuit and elements of the integrated decoupling circuit produce a reactance through the conductor of the integrated decoupling circuit, where the reactance is sufficient to prevent self-cancelling between elements of the LC circuit and elements of the integrated decoupling circuit,
    where elements of the LC circuit and elements of the integrated decoupling circuit produce two or more points of high impedance in the MRI RF coil, where the high impedance is at least 1 kΩ.

16. An MRI apparatus, comprising:
a controller, and
an RF coil operably connected to the controller,
where the controller provides the RF coil with a current, a voltage, or a control signal that causes the RF coil to resonate at a desired transmission frequency, and
where the coil comprises:
   an LC circuit, and
   an integrated decoupling circuit attached to the LC circuit, where the integrated decoupling circuit decouples the RF coil from one or more other RF coils associated with the MRI apparatus,
      where the integrated decoupling circuit includes one or more conductors, one or more capacitors, a PIN diode, and a tunable element,
      where the tunable element controls, at least in part, a frequency at which the RF coil transmits RF energy,
      where the PIN diode selectively electrically isolates the integrated decoupling circuit from the LC circuit;
      where elements of the LC circuit and elements of the integrated decoupling circuit produce a reactance through the conductor of the integrated decoupling circuit, where the reactance is sufficient to prevent self-cancelling between elements of the LC circuit and elements of the integrated decoupling circuit, and
      where the PIN diode is driven to a first state when the RF coil is transmitting RF energy, where the first state blocks current from flowing through the LC circuit, and where the PIN diode is driven to a second different state when the RF coil is not transmitting RF energy, where the second state allows current to flow through the LC circuit.

17. The MRI apparatus of claim 16, where the tunable element is tunable with respect to resistance, capacitance, or inductance, where the resistance, capacitance and inductance control, at least in part, the frequency at which the LC circuit resonates during RF transmission.

18. The MRI apparatus of claim 17, where elements of the LC circuit and elements of the integrated decoupling circuit produce two or more points of high impedance in the RF coil, where the high impedance is at least 1 kΩ.

* * * * *